(12) United States Patent　　(10) Patent No.: US 8,049,646 B2
Togashi　　(45) Date of Patent: Nov. 1, 2011

(54) KEY INPUT DEVICE AND KEY SCAN METHOD

(75) Inventor: Masahiro Togashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 978 days.

(21) Appl. No.: 11/864,655

(22) Filed: Sep. 28, 2007

(65) Prior Publication Data

US 2008/0079611 A1　Apr. 3, 2008

(30) Foreign Application Priority Data

Oct. 3, 2006　(JP) ................ 2006-271428

(51) Int. Cl.
*H03M 11/00*　(2006.01)
*H03K 17/94*　(2006.01)
*G06F 3/02*　(2006.01)

(52) U.S. Cl. ............ 341/26; 341/22; 345/168

(58) Field of Classification Search ........... 340/407.2; 341/22–34; 345/168–172; 361/679.08–679.17; 200/19.06
See application file for complete search history.

(56) References Cited

U.S. PATENT DOCUMENTS

| 5,534,860 | A * | 7/1996 | Phillips et al. | 341/22 |
| 5,798,716 | A * | 8/1998 | Davis | 341/26 |
| 5,805,085 | A * | 9/1998 | Hsu et al. | 341/26 |
| 6,680,678 | B2 * | 1/2004 | Chiu et al. | 341/22 |
| 7,742,040 | B2 * | 6/2010 | Jamieson et al. | 345/168 |
| 2008/0111712 | A1 * | 5/2008 | Himpe | 341/26 |

* cited by examiner

*Primary Examiner* — Timothy Edwards, Jr.
*Assistant Examiner* — Jerold Murphy
(74) *Attorney, Agent, or Firm* — Sughrue Mion, PLLC

(57) ABSTRACT

In a key input device, a control section is configured to receives a key return signal as an interrupt signal in a standby mode, to set a normal mode in response to the interrupt signal, and to perform a key scan operation in the normal mode to determine an operated key. A key matrix section having a plurality of keys and configured to supply the key return signal to the control section in response to an operation to the operated key of the plurality of keys.

16 Claims, 15 Drawing Sheets

Fig. 6
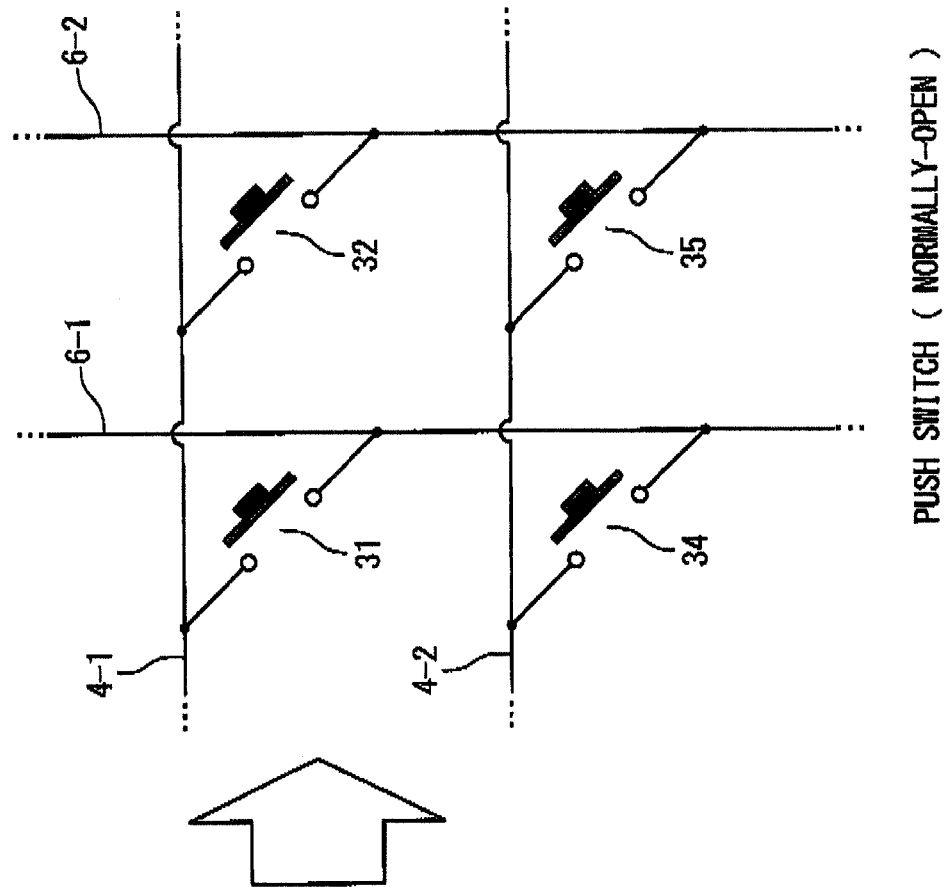
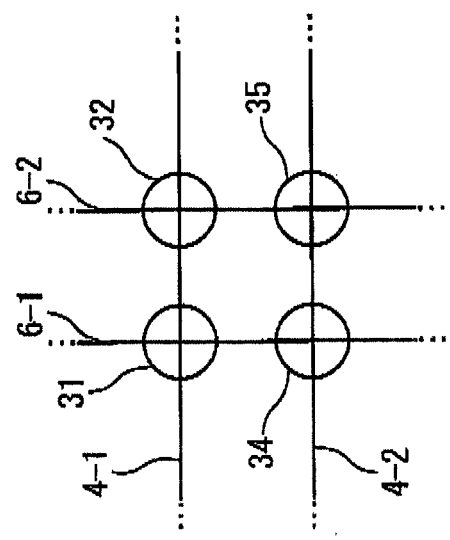

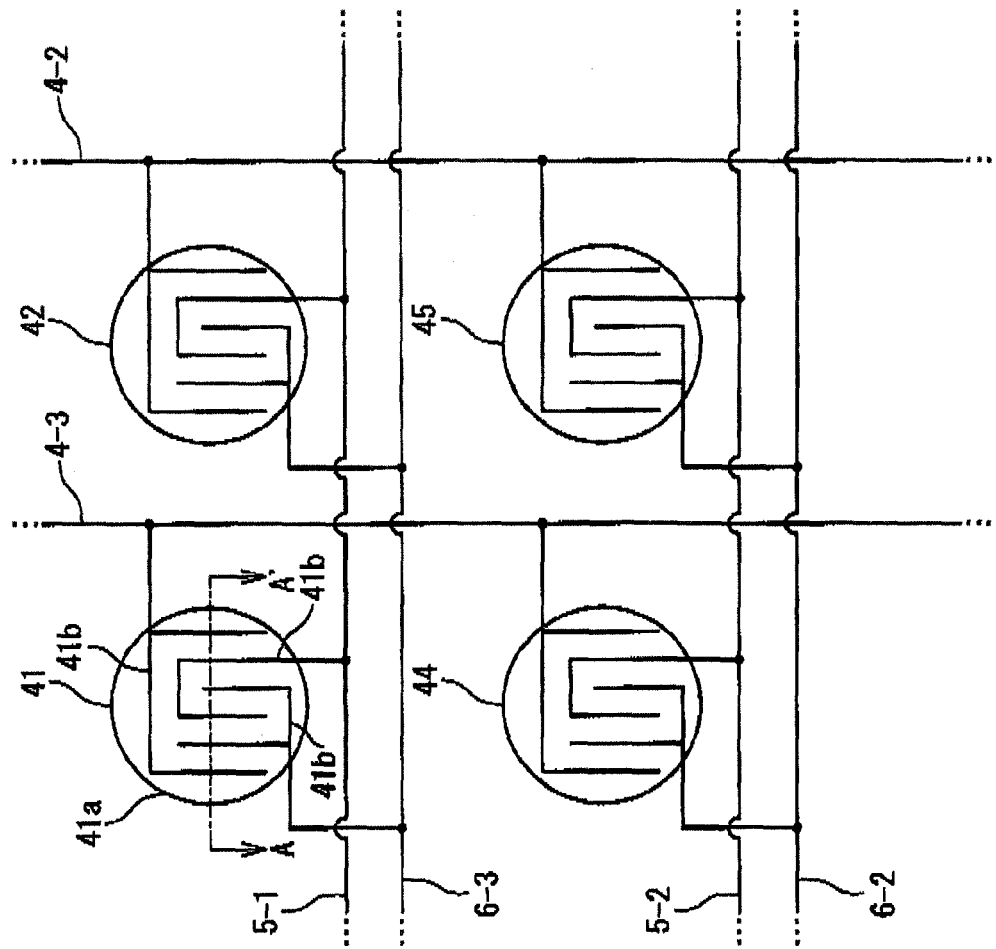
Fig. 7
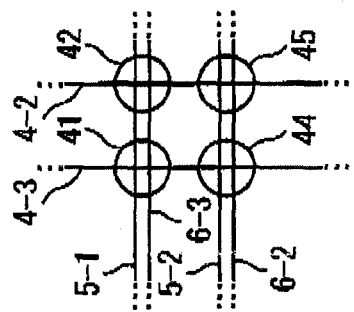

○ ; DETECTION OF KEY RETURN SIGNAL
× ; UN-DETECTING. OF KEY RETURN SIGNAL

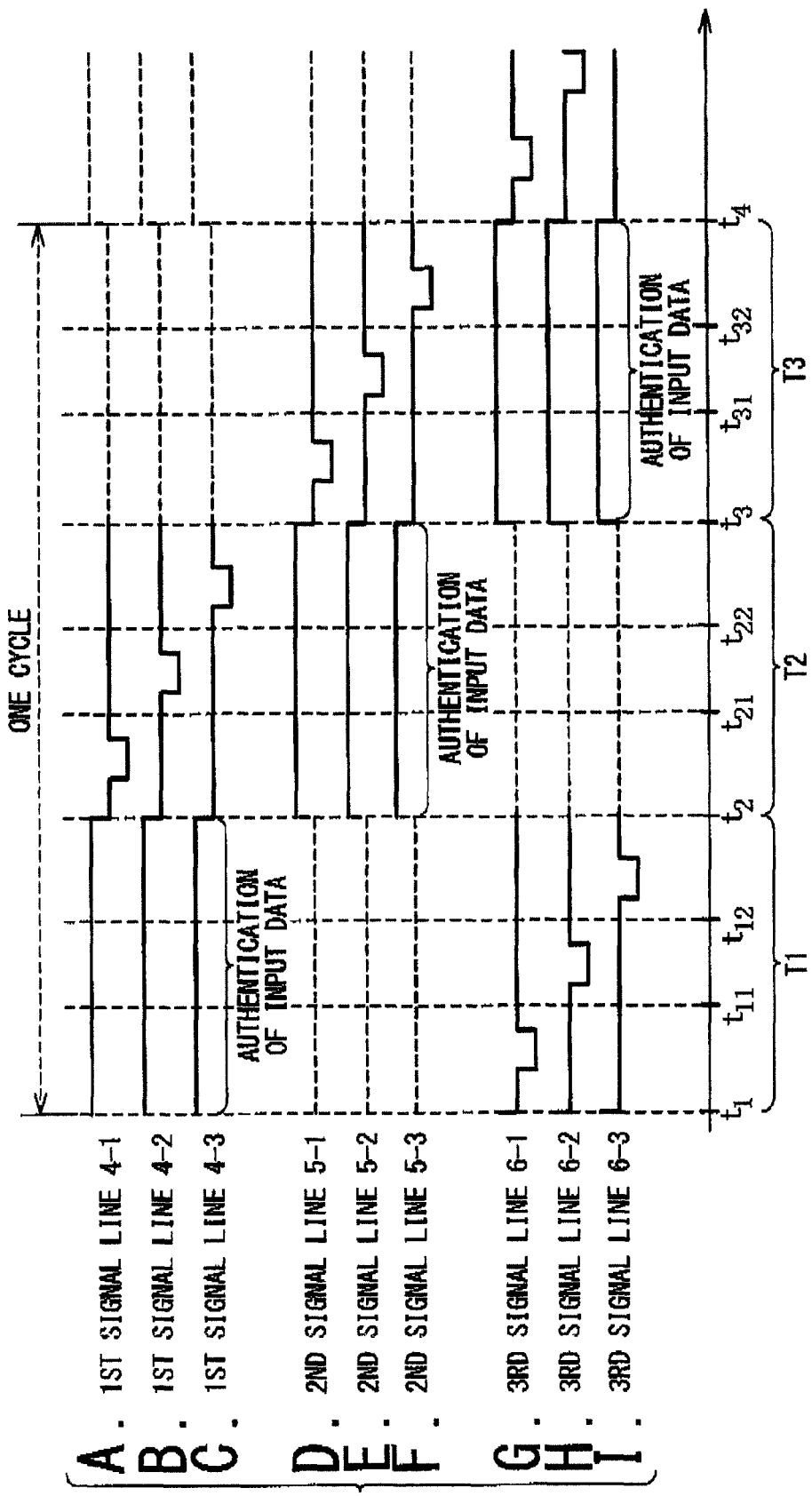

KEY INPUT DEVICE AND KEY SCAN METHOD

BACKGROUND OF THE INVENTION

1. Field of the Invention

The present invention relates to a key input device which generates a key code in response to an operation of a user.

2. Description of the Related Art

A key input device (key matrix device) is known. For example, a keyboard of a computer, a keypad of a calculator, keypads of a remote control device, an electronic lock, etc. are equipped with the key input device. The key input device generates a data and an instruction in the form of a key code in response to an operation of a key switch, and outputs the key code to a processor. The key input device has a key matrix section and a control section. A plurality of key switches are arranged in a predetermined array in the key matrix section. The control section performs a key scan operation to monitor the operation of any of key switches and to detect the position of the operated key switch.

The key input device is demanded to have a miniature size, a light in weight, advanced functions, and so on (see JU-A-Showa 62-138237, and JP-P2001-255983A). The control section is generally composed of an integrated circuit. For this reason, there is a case that the number of terminals of the integrated circuit is restricted, by which key signals from the key matrix section are received. Therefore, a technique is demanded for attaining the advanced function of the key input device without increasing the number of terminals of the integrated circuit.

FIG. 1 is a block diagram showing a configuration of a key input device described in Japanese Laid Open Utility Model application (JU-A-showa 62-138237) as Related Art 1. Referring to FIG. 1, the key input device is provided with two of first and second key matrix circuits 101 and 102. The first key matrix circuit 101 is provided as standard equipment, and the second key matrix circuit 102 is provided for extension. A control section 106 simultaneously searches the both matrix circuits. This control section includes a search section and a matrix circuit determining section. The search section simultaneously outputs one or a plurality of scan signals of different phases from one or a plurality of common scan output terminals to the both matrix circuits. The search section simultaneously scans the both matrix circuits, and a scan signal passing through the operated key switch of the both matrix circuits is supplied to a common scan input terminal. Moreover, the matrix circuit determining section samples the scan signals at a predetermined time from the output of the scan signals, and compares a signal level of each of the sampled scan signals with a threshold level to determine the operated key switch of the key matrix circuit.

Here, in the key input device in the Related Art 1, output terminals of the first key matrix circuit 101 for scan signals are respectively connected to the common scan input terminals, and also output terminals of the second key matrix circuit 102 for scan signals are respectively connected to the common scan input terminals. The key input device in the Related Art 1 is also provided with: distinction side diodes for backflow prevention having anodes respectively connected to the output terminals of scan signals of the second key matrix circuit 102; and an integrated circuit (IC) 106 that holds the high level of cathodes of the distinction side diodes for a period longer than a predetermined time period in a delayed manner to achieve application to the predetermined terminal.

In the key input device of Related Art 1, when a key switch of the first key matrix circuit 101 is operated or pushed down, a scan signal passing through the key switch is supplied to the common scan input terminal. At this time, the scan signal is not supplied to the distinction side diode due to blockade by the search side diode, so that the cathode of this distinction side diode is held at a low level. When a key switch of the second key matrix circuit 102 is pushed down, a scan signal passing through this key switch is supplied to the common scan input terminal through the search side diode and also supplied to a signal holding circuit through the distinction side diode. At this time, the cathode of the distinction side diode is held at a high level based on the high level of the scan signal for the predetermined period from the leading edge by the signal holding circuit. Also, this cathode becomes high for the predetermined period for sampling by the matrix circuit determining section.

With this configuration, the above-mentioned technique achieves a key input device that, when the first key matrix circuit 101 and the second key matrix circuit 102 are simultaneously scanned to determine the operated key switch of the key matrix section in an operation of the plurality of search side diodes (Da to Dh), the distinction side diodes (Da' to Dh'), and the integrated circuit 106.

The above-described key input device requires a plurality of diodes as its components for determining operated key switch in the first key matrix circuit 101 and the second key matrix circuit 102.

FIG. 2 is a block diagram illustrating a configuration of a key input device disclosed in Japanese Laid Open Patent Publication (JP-P2001-255983A) as Related Art 2, Referring to FIG. 2, the key input device can detect more pushed-down key switches in a same number of terminals, by adding a simple hardware circuit. When a pulse signal is supplied from one of lines, signals are outputted from all the other lines in accordance with key states. Thus, while sequentially scanning the lines, the key input device detects pushed-down states of key switches K00 to K55.

The key input device described in JU-A-Showa 62-138237 can perform the key scan for a large number of keys, but requires a plurality of diodes as its components in order to determine the pushed-down key. Therefore, it is desired to provide technique for reducing the number of circuit components of the key matrix part.

Recently, a key input devices with small size is demanded to achieve power consumption reduction. For this purpose, normally the key scan operation is stopped and the key scan operation is started in response to a key operation as a trigger.

The key matrix part of the key input device described in JP-P2001-255983A requires a plurality of diodes to determine a pushed-down key, but the number of components is less than those of the key input device described in JU-A-Showa 62-138237. However, in the key input device described in JP-P2001-255983A, once the key scan stops, it is difficult to newly start a key scan by detecting the pushing-down of any of all the keys.

SUMMARY OF THE INVENTION

In a first embodiment of the present invention, a key input device includes a control section configured to receives a key return signal as an interrupt signal in a standby mode, to set a normal mode in response to the interrupt signal, and to perform a key scan operation in the normal mode to determine an operated key; and a key matrix section having a plurality of keys and configured to supply the key return signal to the control section in response to an operation to the operated key of the plurality of keys.

Also, in a second embodiment of the present invention, a method of detecting a data of an operated key in a key input device, is achieved by generating a key return signal in response to an operation to the operated key of a plurality of keys of a key matrix section; by receiving the key return signal as an interrupt signal in a standby mode; by switching an operation mode from the standby mode to a normal mode in response to the interrupt signal; and by performing a key scan operation in the normal mode to determine an operated key.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is a circuit diagram illustrating a configuration of key switches in the key input device according to the embodiment of the present invention;

FIG. 7 is a circuit diagram illustrating a configuration of the key switches in the key input device according to the embodiment of the present invention;

FIGS. 12A to 12I are time charts showing a detection operation of a pushed-down key switch;

DESCRIPTION OF THE PREFERRED EMBODIMENTS

Hereinafter, a key input device of the present invention will be described in detail with reference to the attached drawings.

Figure 3:
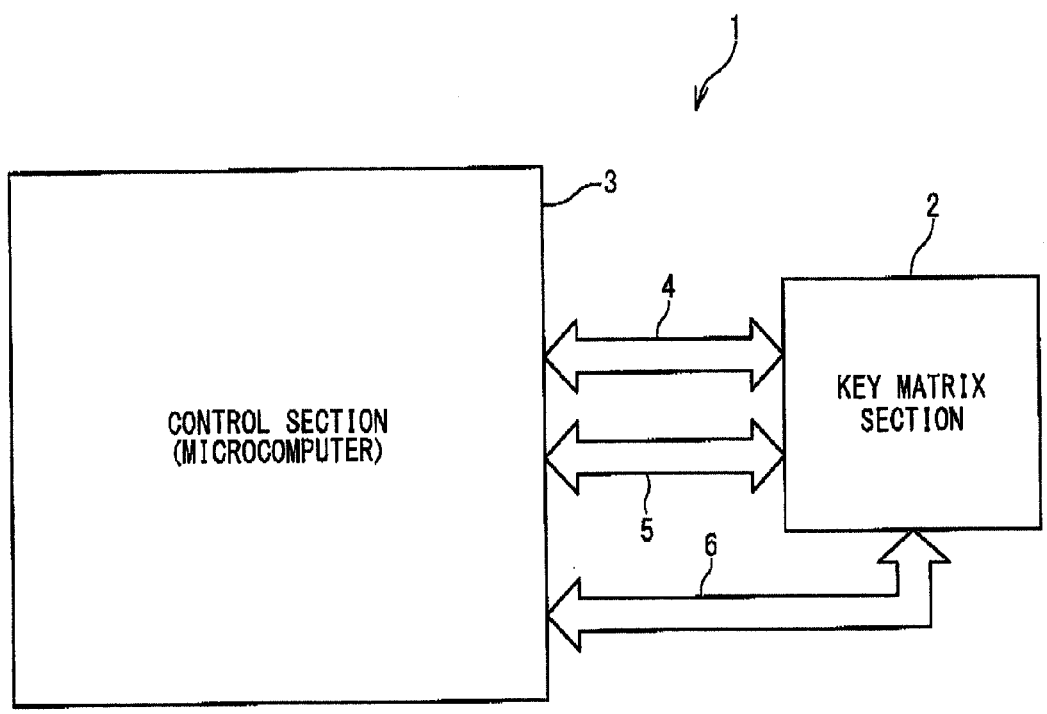
FIG. 3 is a block diagram illustrating a configuration of a key input device according to an embodiment of the present invention.

FIG. 3 is a block diagram showing a configuration of the key input device 1 according to an embodiment of the present invention. The key input device 1 in the embodiment has a key matrix section 2 and a control section 3. The key matrix section 2 is connected to a control section 3 via a first signal line group 4, a second signal line group 5, and a third signal line group 6. The key matrix section 2 has a plurality of key switches.

The control section 3 performs a key scan operation and generates a scan signal (to be referred to as a key source signal hereinafter). The control section 3 supplies the key source signal to the key matrix section 2 via the first signal line group 4, the second signal line group 5, or the third signal line group 6. Each of the plurality of key switches is operated or pushed down by a user, and supplies a key code data of the operated key switch to the control section 3 by returning the key source signal as a key return signal.

Figure 4:
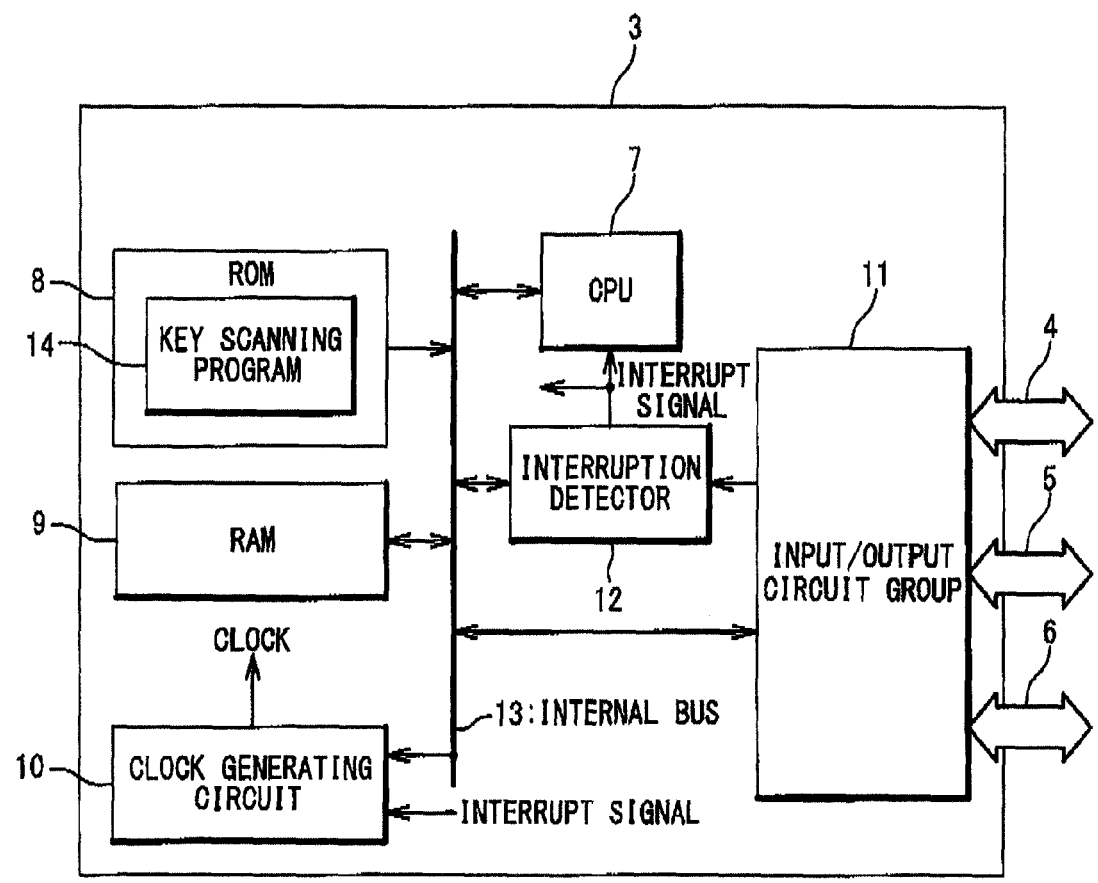
FIG. 4 is a block diagram illustrating a configuration of a control section in the key input device according to the embodiment of the present invention.

FIG. 4 shows a configuration of the control section 3. The control section 3 has a CPU (Central Processing Unit) 7, a ROM (Read Only Memory) 8 for storing programs such as a key scanning program, a RAM (Random Access Memory) 9, a clock generating circuit 10, an input/output circuit group 11, an interruption detector 12, and an internal bus 13.

The CPU 7 accesses peripheral circuits such as the RAM 9, the interruption detector 12, and the input/output circuit group 11 via the internal bus 13. The CPU 7 writes and reads data into and from the peripheral circuit based on the program stored in the ROM 8. The CPU 7 outputs the key source signal via the input/output circuit group 11, and reads a key return signal, which is generated based on the key source signal, via the input/output circuit group 11. When a preset condition to a standby mode is met, the CPU 7 outputs a command for stopping supply of a clock signal to the clock generating circuit 10. When the clock generating circuit 10 stops the supply of the clock signal, the control section 3 shifts to the standby mode.

The ROM 8 is a storage unit which can continue to hold data without being dependent on supply of electric power. In this embodiment, the ROM 8 is not always read-only. Therefore, the ROM 8 may be configured of a non-volatile memory such as a flash memory.

The RAM 9 is a storage unit to which read and write can be performed. In this embodiment, the RAM 9 stores the key return signal supplied in the key scan operation for a predetermined time. The key return signal stored in the RAM 9 is referred to in a key determining process to be described later. In this embodiment, the RAM 9 is exemplified as a semiconductor memory device such as a Static RAM.

In a normal mode, the clock generating circuit 10 supplies a clock signal to the control section 3. In the standby mode, the clock generating circuit 10 does not supply the clock signal. The clock generating circuit 10 receives an interrupt signal in the standby mode, and enters the normal mode in response to the interrupt signal. When being released from the standby mode, the clock generating circuit 10 starts supply of the clock signal again.

The input/output circuit group 11 outputs the key source signal to the key matrix section 2. The input/output circuit group 11 receives the key return signal from the control section 3, and supplies the key return signal to circuits such as the CPU 7 and the RAM 9 via the internal bus 13.

When the control section 3 is in the standby mode, the interruption detector 12 monitors whether the key matrix section 2 has been operated. When detecting an operation of the key matrix section 2 from an interruption detection signal outputted from the input/output circuit group 11, the interruption detector 12 generates the interrupt signal to output to the CPU 7 and the clock generating circuit 10.

Figure 5:
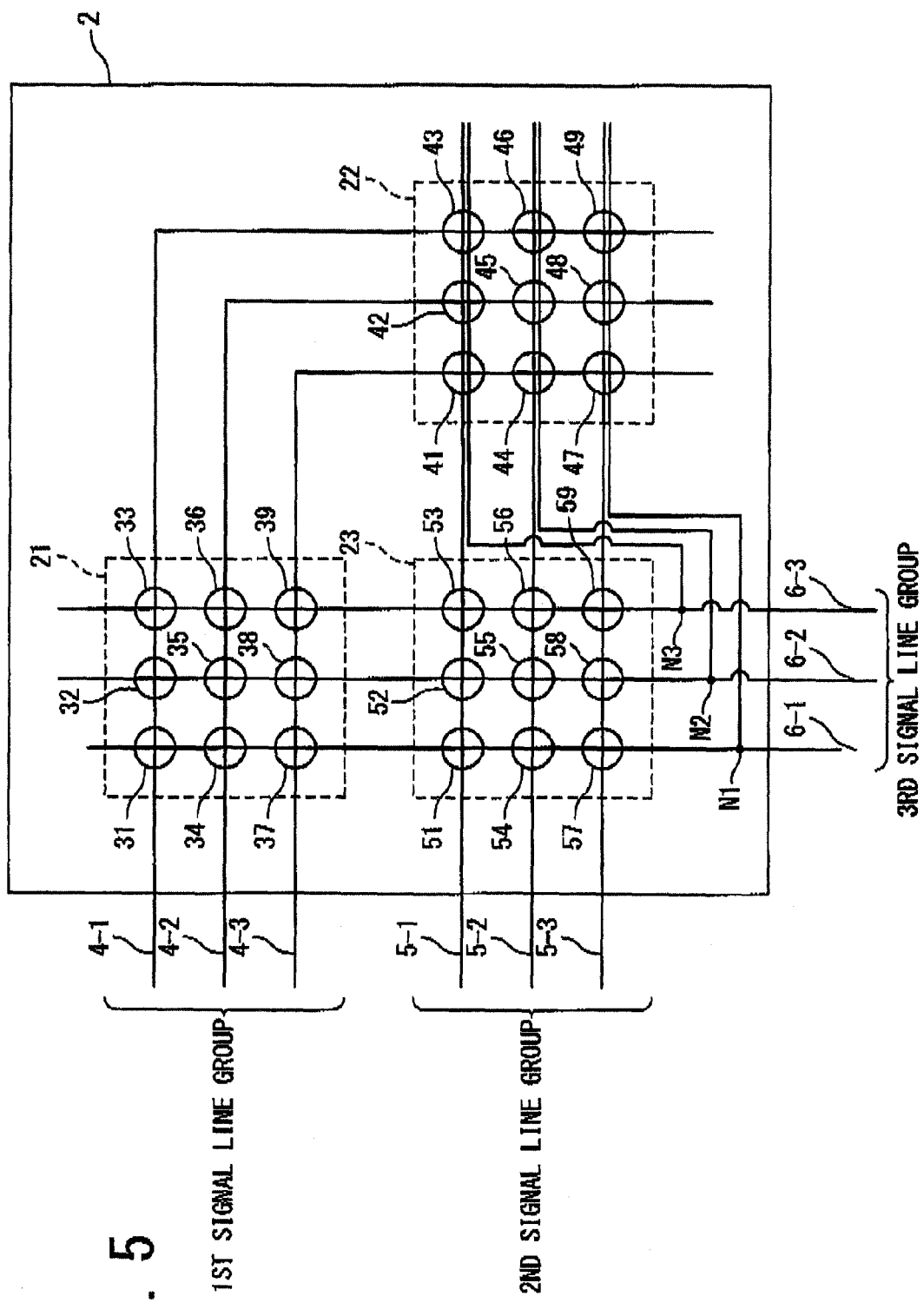
FIG. 5 is a block diagram illustrating a configuration of a key matrix section in the key input device according to the embodiment of the present invention.

FIG. 5 is a block diagram showing a configuration of the key matrix section 2. The key matrix section 2 has a plurality of key switches which are grouped into three groups. The three groups are a first key switch group 21, a second key switch group 22, and a third key switch group 23. The key matrix section 2 includes a first signal line group 4, a second signal line group 5, and a third signal line group 6. The first signal line group 4 has first signal lines (electric wirings) 4-1, 4-2, and 4-3. The second signal line group 5 has second signal lines (electric wirings) 5-1, 5-2, and 5-3. The third signal line group 6 has third signal lines (electric wirings) 6-1, 6-2, and 6-3. In this embodiment, there is no restriction in the number of signal lines of each signal line group.

Each of the first key switch group 21 to the third key switch group 23 is equipped with nine key switches. This configuration does not restrict a configuration of the key matrix section 2 in the present invention. For example, the first signal line group 4 may be provided with four signal lines. In that case, 12 key switches are arranged at the first key switch group 21 and the second key switch group 22.

As described above, the first key switch group 21 contains nine key switches 39. The second key switch group 22 contains nine key switches 49. The third key switch group 23 contains nine key switches 51 to 59. The first signal line group 4 is provided for the first key switch group 21 and the second key switch group 22. The second signal line group 5 is provided for the second key switch group 22 and the third key switch group 23. The third signal line group 6 is provided for the first key switch group 21, the second key switch group 22, and the third key switch group 23.

Each of the plurality of key switches of the key matrix section 2 connects two or three signal lines corresponding to the key switch in response to a key operation by a user. For example, when the first key switch 31 of the first key switch group 21 is pushed down, the first key switch 31 connects the first signal line 4-1 and the third signal line 6-1. When the third key switch 51 of the third key switch group 23 is pushed down, the third key switch 51 connects the second signal line 5-1 and the third signal line 6-1. When the second key switch 41 of the second key switch group 22 is pushed down, the second key switch 41 connects the first signal line 4-3, the second signal line 5-1, and the third signal line 6-3.

FIG. 6 shows a configuration of the first key switch group 21. In FIG. 6, the key switches 31, 32, 34, and 35 of the first key switch group 21 are shown. All the key switches of the first key switch group 21 a normally-open type of push switch. The third key switch group 23 has the same structure as that of the key switch group 21.

Figure 8:
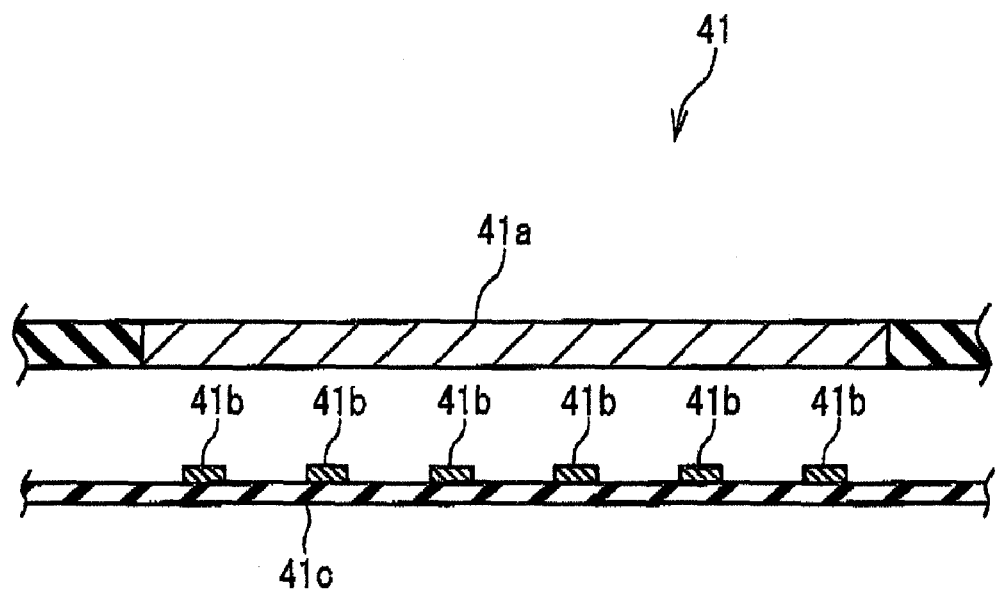
FIG. 8 is a sectional view illustrating a configuration of the key switches in the key input device according to the embodiment of the present invention.

FIG. 7 shows a configuration of the second key switch group 22. In FIG. 7 the key switch 41, 42, 44, and 45 of the second key switch group 22 are shown. Each key switch of the second key switch group 22 has a same construction. Therefore, the key switch 41 will be described below. The key switch 41 is composed of a conductive connecting section 41a and conductive wirings 41b which are connected to the signal lines. As shown in FIG. 8, the connecting section 41a is provided above the wirings 41b in a normal state, and connects the wirings 41b in response to an operation of the key switch 41 by a user. For example, when the user pushes the key switch 41, the connecting section 41a connects the first signal line 4-3, the second signal line 5-1, and the third signal line 6-3.

Figure 9:
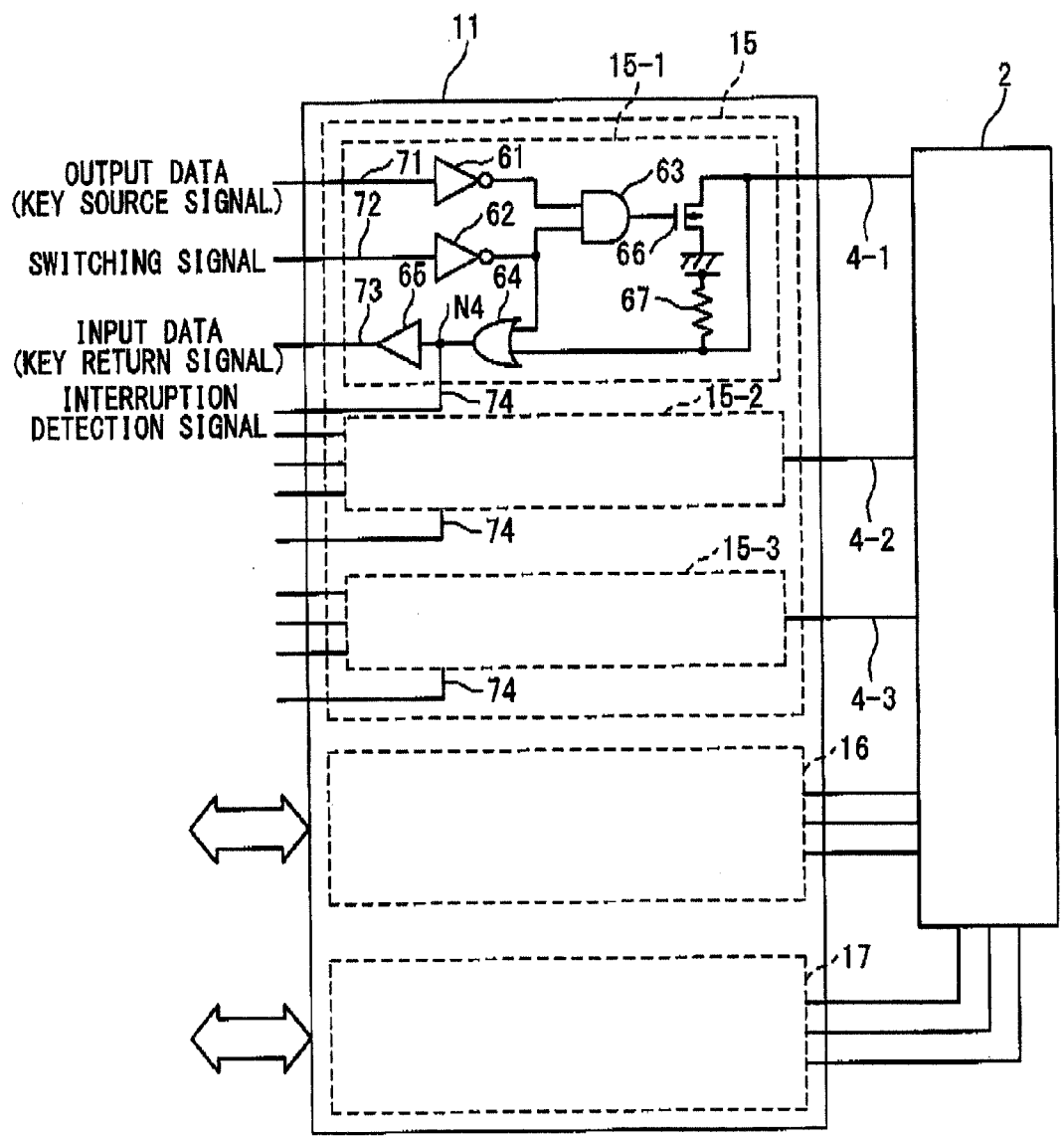
FIG. 9 is a circuit diagram illustrating a configuration of an input-output circuit group.

FIG. 9 shows a configuration of the input/output circuit group 11. The input/output circuit group 11 has a first input/output circuit block 15, a second input/output circuit block 16, and a third input/output circuit block 17. The first input/output circuit block 15 is provided to be connected to the first signal line group 4, the second input/output circuit block 16 is provided to be connected to the second signal line group 5, and the third input/output circuit block 17 is provided to be connected to the third signal line group 6.

The first input/output circuit block 15, the second input/output circuit block 16, and the third input/output circuit block 17 have a same circuit configuration. Therefore, the configuration of the first input/output circuit block 15 will be described. The first input/output circuit block 15 includes a first input/output circuit 15-1, a second input/output circuit 15-2, and a third input/output circuit 15-3. The first input/output circuit 15-1 is connected to the first signal line 4-1, the second input/output circuit 15-2 is connected to the first signal line 4-2, and the third input/output circuit 15-3 is connected to the first signal line 4-3.

The first input/output circuit 15-1, the second input/output circuit 15-2, and the third input/output circuit 15-3 have a same circuit configuration. Therefore, the configuration of the first input/output circuit 15-1 will be described. The first input/output circuit 15-1 includes a first inverter 61, a second inverter 62, an AND circuit 63, an OR circuit 64, a buffer 65, an N-channel MOSFET 66, and a resistance 67. An input terminal of the first inverter 61 is connected to a data signal line 71. An output terminal of the first inverter 61 is connected to a first input terminal of the AND circuit 63. Thus, the first inverter 61 receives an output data signal (key source signal) transferred on the data signal line 71. An input terminal of the second inverter 62 is connected to a switching signal supply line 72. An output terminal of the second inverter 62 is connected to a second input terminal of the AND circuit 63. Thus, the second inverter 62 receives a switching signal transferred on the switching signal supply line 72.

An output terminal of the AND circuit 63 is connected to a gate electrode of the N-channel MOSFET 66. In response to a signal supplied to the gate electrode, the N-channel MOSFET is activated. A drain electrode of the N-channel MOSFET 66 is connected to the first signal line 4-1. By the N-channel MOSFET 66 being activated, the key source signal (Low level) is supplied to the first signal line 4-1. When the switching signal supply line 72 is in a High level, the input/output circuit group 11 of the control section 3 inputs the key return signal thereinto. The resistance 67 functions as a pull-up resistor, when the switching signal supply line 72 is in the High level. When the switching signal supply line 72 is in a Low level, the input/output circuit group 11 outputs the key source signal to the key matrix section 2. At that time, the resistance 67 does not function as a pull-up resistor. For example, such a function of the resistance 67 may be achieved by connecting a resistance element (not shown) and a transistor (not shown) in series. In this case, a gate electrode of the transistor is connected to the switching signal supply line 72. The ON and OFF states of the transistor are controlled based on the switching signal. The transistor is activated when receiving the key return signal into the control section 3. At this time, the resistance 67 functions as a pull-up resistor. The transistor is deactivated when the key source signal is received from the key matrix section 2. At this time, the resistance 67 functions as a pull-up resistor. It is possible to reduce a current flowing through the resistance 67 into the N-channel MOSFET 66, when the key source signal is outputted.

The AND circuit 63 supplies a signal of a high level to a gate electrode of the N-channel MOSFET 66, when output data is in a low level and the switching signal is in a low level. The N-channel MOSFET 66 is activated in response to the signal of the high level to supply the key source signal to the first signal line 4-1. A first input terminal of the OR circuit 64 is connected to an output terminal of the second inverter 62, A second input terminal of the OR circuit 64 is connected to the first signal line 4-1. An output terminal of the OR circuit 64 is connected to a buffer 65. A signal outputted from a buffer 65 is supplied to a data signal line 73 through the buffer 65 as a data to the control section 3. The output terminal of the OR circuit 64 is connected to the interruption detection signal line 74 via a node N4. The interruption detection signal line 74 supplies the interruption detection signal outputted from the OR circuit 64 to the interruption detector 12. When the switching signal of the high level is supplied to the second inverter 62, the AND circuit 63 outputs the signal of the low level. In response to the signal of the Low level, the N-channel MOSFET 66 is deactivated. The first input/output circuit 15-1 is allowed to receive the key return signal.

In this embodiment, the first input/output circuit 15-1 functions as an output circuit which outputs the key source signal to the key matrix section 2. The first input/output circuit 15-1 functions as an input circuit which receives the key return signal from the key matrix section 2. These functions are switched in response to the switching signal. Each of the plurality of input/output circuits of the input/output circuit group 11 monitors the key return signal for every predetermined period. The control section 3 recognizes one operated key switch of the plurality of key switches in response to the detected key return signal.

Figure 10:
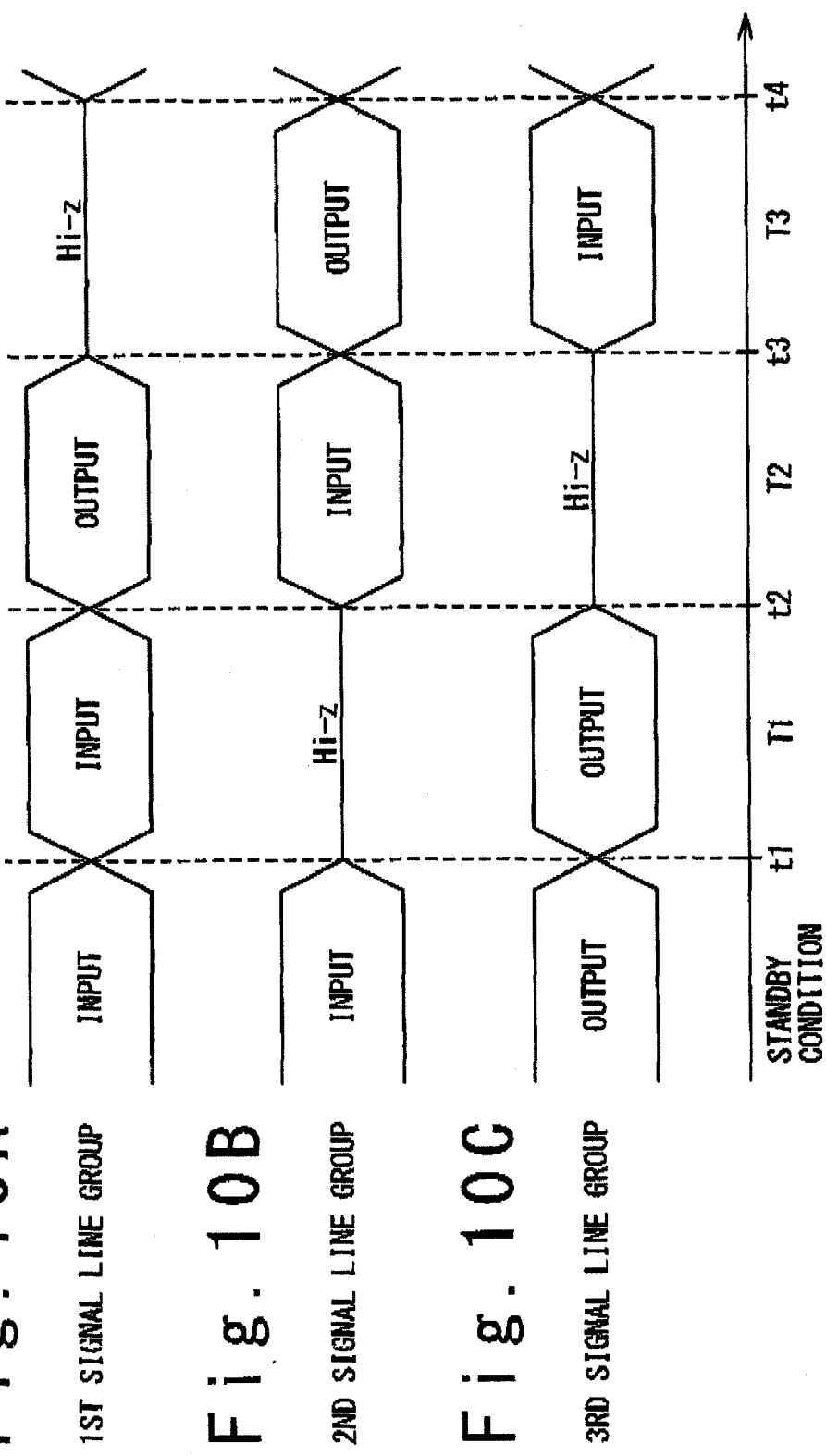
FIGS. 10A to 10C are time charts showing a switching operation between an input and an output in each terminal in the key input device according to the embodiment of the present invention.

Hereinafter, the operation of the key input device 1 of this embodiment will be described. FIGS. 10A to 10C are time charts showing the operations of the plurality of input/output circuits 15-1, 15-2 and 15-3 of the input/output circuit group 11. The input/output circuit group 11 is in the standby mode before a time t1.

At time t1, the control section 3 starts the key scan operation in response to the CPU 7 which receives the interrupt signal from the interruption detector 12 and is set from the standby mode to the normal mode. At this time, the CPU 7 supplies the switching signal to the input/output circuit group 11. In response to the switching signal, the input/output circuit group 11 sets the first and second signal line group 4 as an input side, and sets the third signal line group 6 as an output side.

As shown in FIG. 9, during a period T1 from the time t1 to time t2, the signal of the high level is supplied to the first input/output circuit 15 as the switching signal, and the signal of the low level is supplied to the third input/output circuit 17 as a switching signal.

After the period T1 passes, at the time t2, the CPU 7 supplies a new switching signal to the input/output circuit group 11. In response to the new switching signal, the input/output circuit group 11 sets the second signal line group 5 as an input side, and sets the first signal line group 4 as an output side. Then, at time t3, the CPU 7 supplies a new switching signal to the input/output circuit group 11. In response to the new switching signal, the input/output circuit group 11 sets the third signal line group 6 as an input side, and sets the second signal line group 5 as an output side.

Each of the plurality of circuit blocks of the input/output circuit group 11 has an input/output circuit connected to each signal line. For example, the first input/output circuit 15-1 is connected to the signal line 4-1, and the second input/output circuit 15-2 is connected to the signal line 4-2. Also, the first input/output circuit 16-1 of the second input/output circuit block 16 is connected to the signal line 5-1, and the second input/output circuit 16-2 of the second input/output circuit block 16 is connected to the signal line 5-2. The control section 3 monitors the key return signal for each period (a period T1, a period T2, and period T3), and detects an operation of a key.

Figure 11:
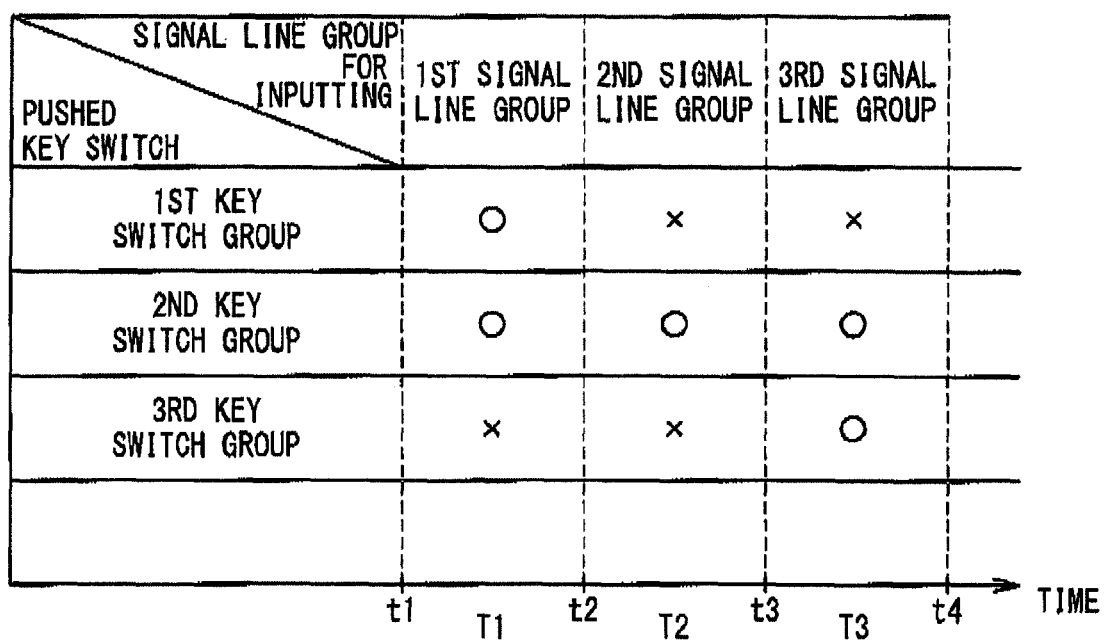
FIG. 11 is a table used for a determination operation of a pushed-down key switch.

FIG. 11 shows a table used for determination of a pushed key switch. In the key input device 1, when one of the key switches 31-39 of the first key switch group 21 is operated or pushed for the period T1, the key return signal is detected via the first signal line group 4. For the period T2 and the period T3, the key return signal is not detected via the second signal line group 5 and the third signal line group 6.

When one of the key switches 41-49 of the second key switch group 22 is operated or pushed for the period T1, the key return signal is detected via the first signal line group 4. For the period T2, the key return signal is detected via the second signal line group 5. Also, for the period T3, the key return signal is detected via the third signal line group 6.

Also, when one of the key switches 51-59 of the third key switch group 23 is operated or pushed for the period T3, the key return signal is detected via the third signal line group 6, In this case, for the period T1 and the period T2, no key return signal is detected via the first signal line group 4 and the second signal line group 5.

The ROM 8 of the key input device 1 stores the table shown in FIG. 11. When the key scan operation is performed, the control section 3 reads the table from the ROM 8. The control section 3 can determines the operated key switch based on the table. It should be noted that the table shown in FIG. 11 has a simplified data structure, in order to make an understanding of the present invention easy. It is desirable that the table is configured to indicate detection/non-detection to each of the plurality of signal lines, in order to detect the operated key switch more correctly.

FIGS. 12A to 12I are time charts showing the key scan operation of the key input device 1 in the present embodiment. Referring to FIGS. 12G to 12I, for the period T1, the key source signals are supplied from the signal lines 6-1, 6-2, and 6-3 of the third signal line group 6. In addition, for the period T1, the signal lines 4-1, 4-2, and 4-3 of the first signal line group 4 are set to receive the key return signals. As shown in FIGS. 12A to 12I, a pulse as the key source signal is supplied to the signal line 6-1 for the period between times t1 and t11. At this time, if the key return signal is detected through the signal line 4-1, the control section 3 determines that the key switch 31 of the first key group 21 or the key switch 49 of the second key group a22 arranged at an intersection between the signal line 6-1 and the signal line 4-1 has been pushed down (see FIG. 5).

Similarly, between the times t1 and t11, if the key return signal is detected through the signal line 4-2, the control section 3 determines that the key switch 34 of the first key group 21 or the key switch 48 of the second key group 22 arranged at an intersection between the signal line 6-1 and the signal line 4-2 has been pushed down. If the key return signal is detected through the signal line 4-3, the control section 3 determines that the key switch 37 of the first key group 21 or the key switch 47 of the second key group 22 arranged at an intersection between the signal line 6-1 and the signal line 4-3 has been pushed down.

Between times t11 and t12, a pulse as the key source signal is supplied to the signal line 6-2, as shown in FIG. 12H. Therefore, by monitoring the key return signal at this time, the control section 3 can determine which of the key switch 32, the key switch 35, the key switch 38, the key switch 44, the key switch 45, and the key switch 46 has been pushed down. The same operation is performed between times t12 and t2. Thus, the control section 3 stores which of the key switches of the first key switch group 21 and the second key switch group 22 has been pushed down for the period T1 from the time t1 to the time t2.

At the time t2, the CPU 7 outputs the switching signal to the plurality of input/output circuits to switch the modes of the plurality of input/output circuits forming the input/output circuit group 11. Through the switching operation, the signal lines 4-1, 4-2, and 4-3 of the first signal line group 4 are set as the output side for the key source signals for a period T2 from the time t2 to a time t3, Moreover, the signal lines 5-1, 5-2, and 5-3 of the second signal line group 5 are set as the input side for key return signals.

As shown in FIG. 12A, between times t2 and t21, a pulse as the key source signal is supplied to the signal line 4-1. Moreover, between times t21 and t22, a pulse as the key source signal is supplied to the signal line 4-2. Further, between times t22 and t3, a pulse as the key source signal is supplied to the signal line 4-3. The control section 3 stores a set of the signal line on which the key return signal is detected and the signal lines on which the key source signal is outputted for the period T2. Thus, the control section 3 can hold which of the key switches of the third key switch group 23 and the second key switch group 22 has been pushed down. For the period T3, the control section 3 operates in the same manner as in the period T1 or the period T2.

The control section 3 performs the key scan operation from the periods T1 to T3, as described above. Comparison between the key return signal stored in this key scan operation and the reference table previously stored is carried out for determination of the key switch pushed down by the user.

Figure 13A:
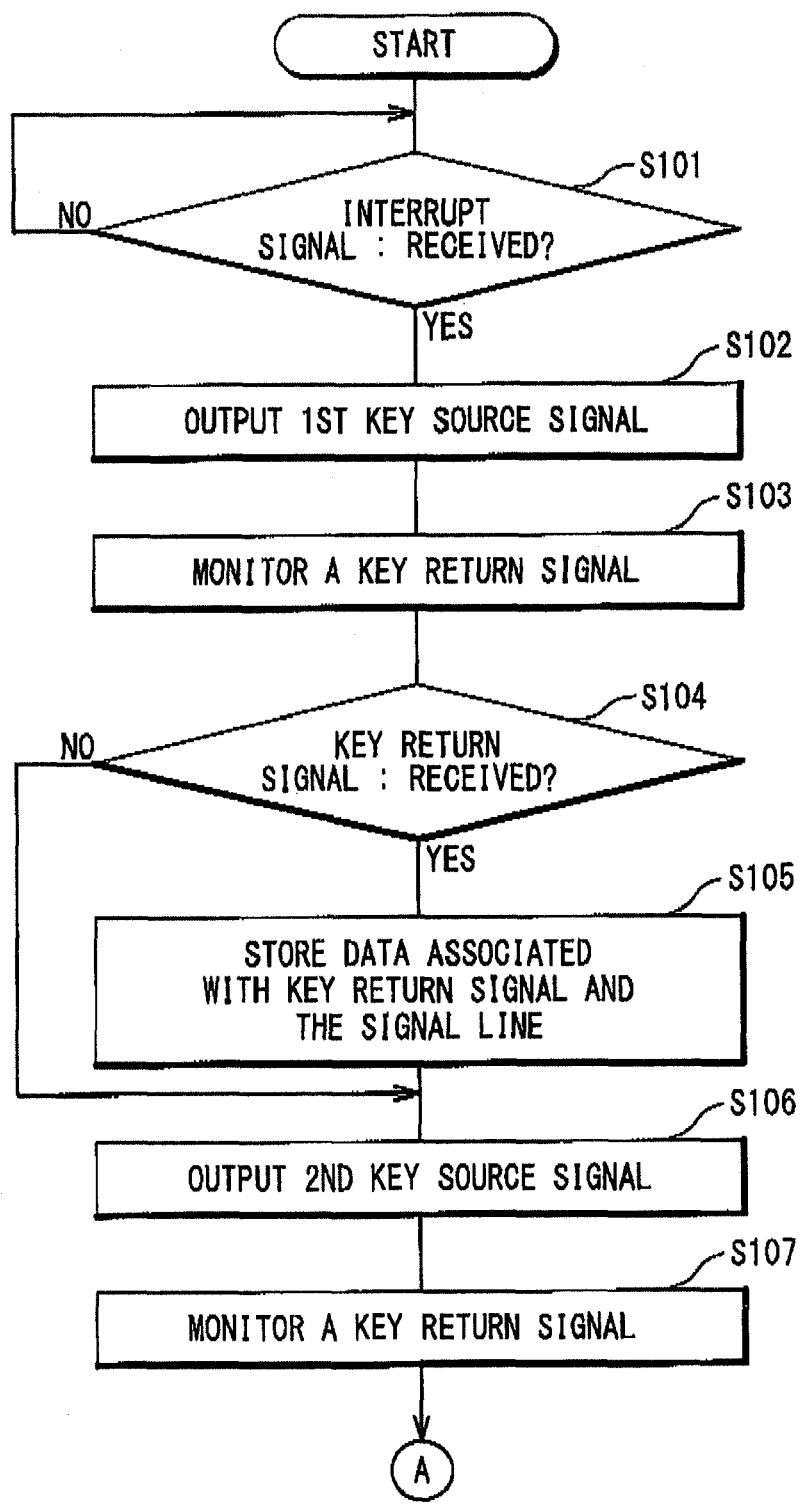
FIGS. 13A and 13B are a flowchart illustrating the key scan operation.
Figure 13B:
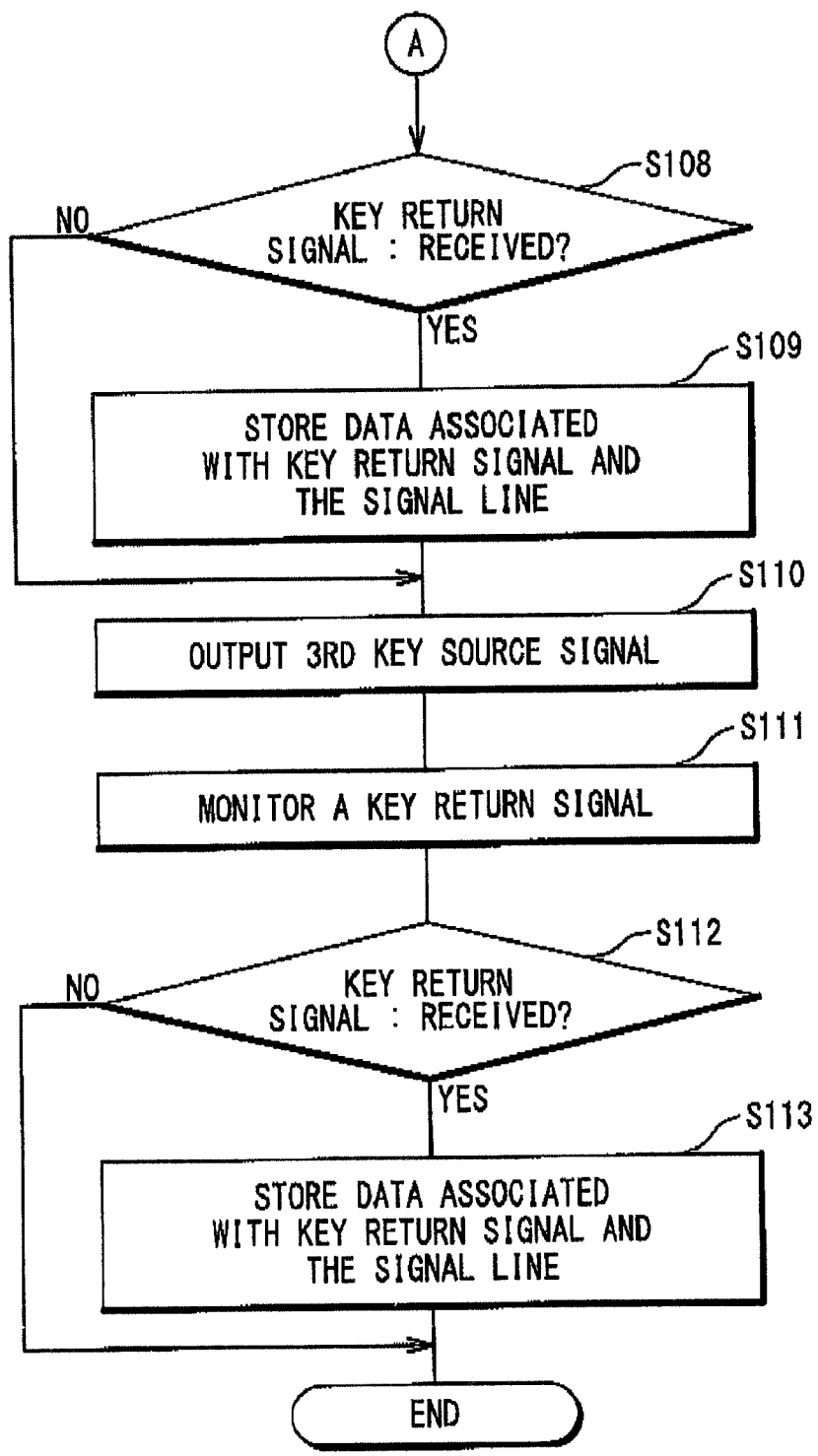

Hereinafter, the key scan operation described above will be described referring to the flowchart. A case that the key scan operation is performed in the period T1 will be described for easier understanding of the operation of the present invention. FIGS. 13A and 13B shows a flowchart of the key scan operation performed in the period T1. Referring to FIG. 13A, at a step S101, the control section 3 in the standby mode determines whether or not an interrupt signal has been received. If the interrupt signal is not received in the standby mode, the process returns, and the control section 3 continuous to be in the standby mode. As a result, if the control section 3 determines that the interrupt signal is received, the process proceeds to a step S102.

At the step S102, the control section 3 outputs a first key source signal through the signal line 6-1 to the key matrix section 2. At step S103, the control section 3 performs a monitoring operation on the key return signal received through the plurality of signal lines of the first signal line group 4 independently from each other.

At step S104, the control section 3 perform a determination of whether or not the control section 3 has received the key return signal corresponding to the first key source signal. If the control section 3 receives the key return signal between the times t1 and t11, the process proceeds to a step S105. If the control section 3 does not received the key return signal, the process proceeds to a step S106. At the step S105, the control section 3 generates a data associated with the received key return signal and the signal line from which the key return signal is received, and stores this data in the RAM 9.

At the step S106, the control section 3 stops the supply of the first key source signal until the time t11, and supplies the second key source signal through the signal line 6-2 to the key matrix section 2. At a step S107, the control section 3 performs the monitoring operation on the key return signal received through the first signal line group 4. At this point, as the operation performed at the step S103, the control section 3 monitors the plurality of signal lines of the first signal line group 4 independently from each other, Referring to FIG. 13B, at a step S108, the control section 3 performs a determination of whether or not the control section 3 receives the key return signal corresponding to the second key source signal.

If the control section 3 has received the key return signal between the times t11 and t12, the process proceeds to a step S109. If the control section 3 has not received the key return signal, the process proceeds to a step S110. In the step S109, as the operation performed in the step S105, the control section 3 generates data associated with the received key return signal and the signal line from which this key return signal is received, and stores this data in the RAM 9.

At the time t12, at a step S110, the control section 3 stops the supply of the second key source signal and supplies a third key source signal through the signal line 6-3 to the key matrix section 2. At a step S111, the control section 3 performs the monitoring operation on the key return signal received through the first signal line group 4. At this point, as the operation performed at the steps S103 and S107, the control section 3 monitors the plurality of signal lines of the first signal line group 4 independently from each other.

At a step S112, the control section 3 performs the determination of whether or not the key return signal corresponding to the third key source signal is received. If the control section 3 receives the key return signal between the times t12 and t2, the process proceeds to a step S113. If the control section 3 does not receive the key return signal, the key scan process for the period T1 ends. At the step S113, the control section 3 generates a data associated with the received key return signal and the signal line from which the key return signal is received, and stores this data in the RAM 9. Thus, the process ends.

By performing the operation described above, the key input device 1 of the present embodiment can individually monitor the plurality of key switches belonging to the first key switch group 21 or the second key switch group 22 to determine whether or not they have been pushed down during the period T1. Thereafter, by performing the same key scan operation for the period T2 and the period T3, the key input device 1 can monitor whether or not they have been pushed down, on all of the plurality of key switches provided in the key matrix section 2. Moreover, by repeating the key scan operation from the periods T1 to T3 a predetermined number of times, the key input device 1 can detect a pushed one of the key switches with higher accuracy.

Figure 14:
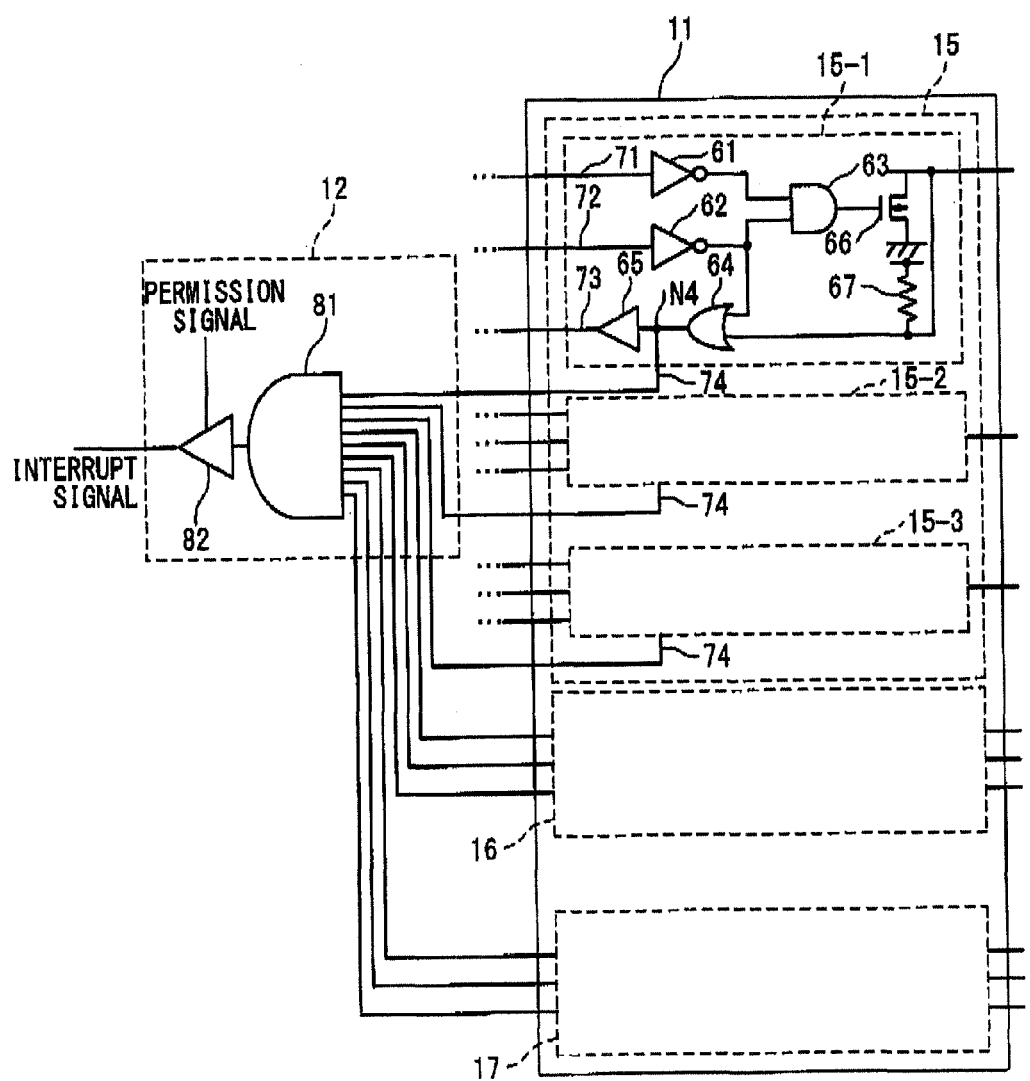
FIG. 14 is a circuit diagram illustrating a configuration of an interrupt detection circuit in the key input device according to the embodiment of the present invention.

Hereinafter, an interrupt signal of the present embodiment will be described. FIG. 14 is a circuit diagram illustrating a configuration of the interruption detection circuit 12. Referring to FIG. 14, the interruption detection circuit 12 includes an AND circuit 81 and a buffer 82. The AND circuit 81 is provided with a plurality of input terminals. As shown in FIG. 14, these input terminals are respectively connected to interrupt detection signal lines 74 of the plurality of input/output circuits provided in the input/output circuit group 11. In the standby mode, the switching signal of the low level is outputted, so that the interruption detection signal of the high level is outputted from the OR circuit 64 in each input/output circuit. The AND circuit 81 calculates a logical product of interruption detection signals supplied through the plurality of interruption detection signal lines 74, and supplies a result of this calculation to the buffer 82. The buffer 82 outputs an interrupt signal based on the signal supplied from the AND circuit 81. In addition, the buffer 82 outputs of the interrupt signal based on a permission signal supplied externally. The interruption detection signal may be neglected in the normal mode based on the permission signal.

Figure 1:
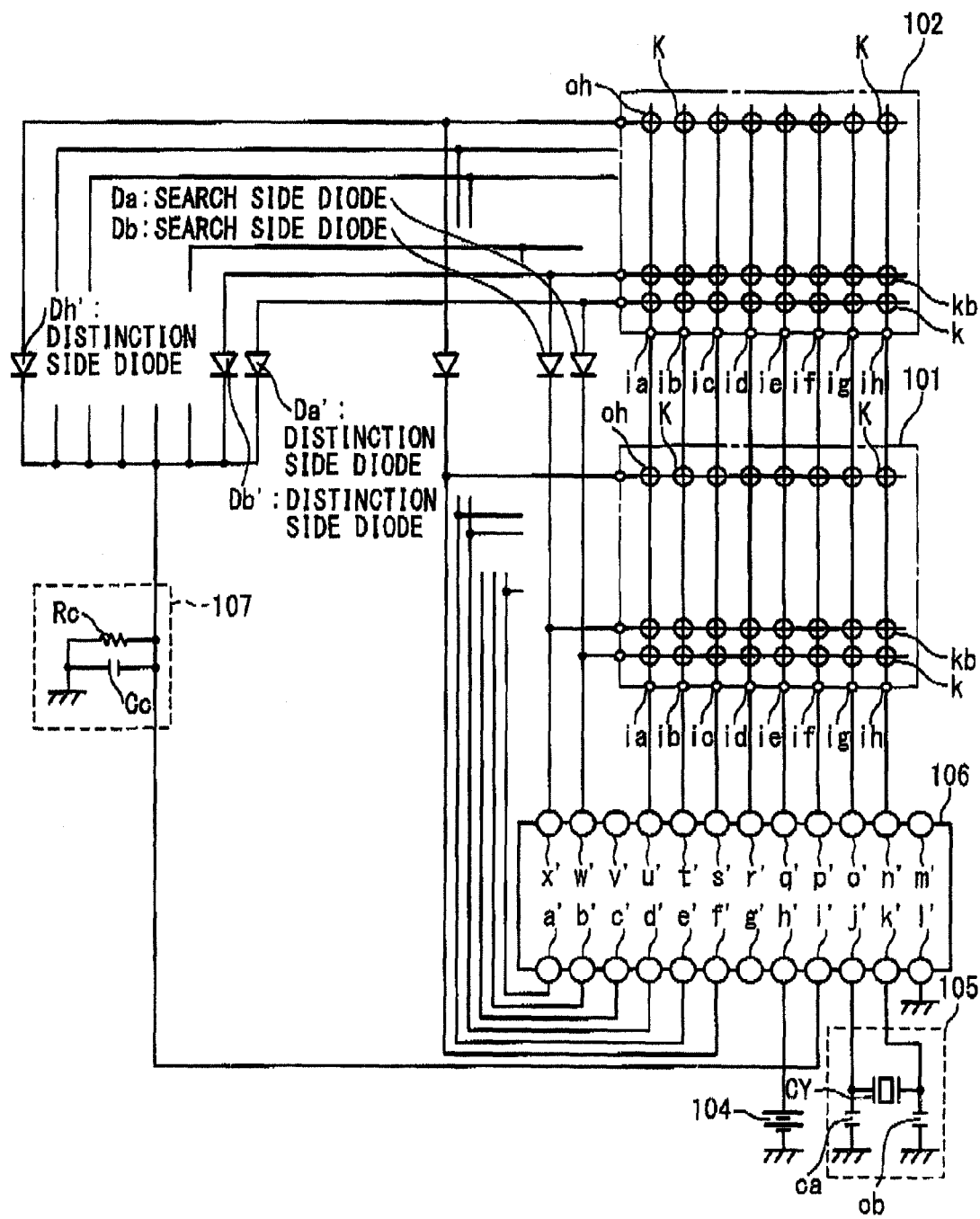
FIG. 1 is a block diagram illustrating a configuration of a related-art key input device.
Figure 2:
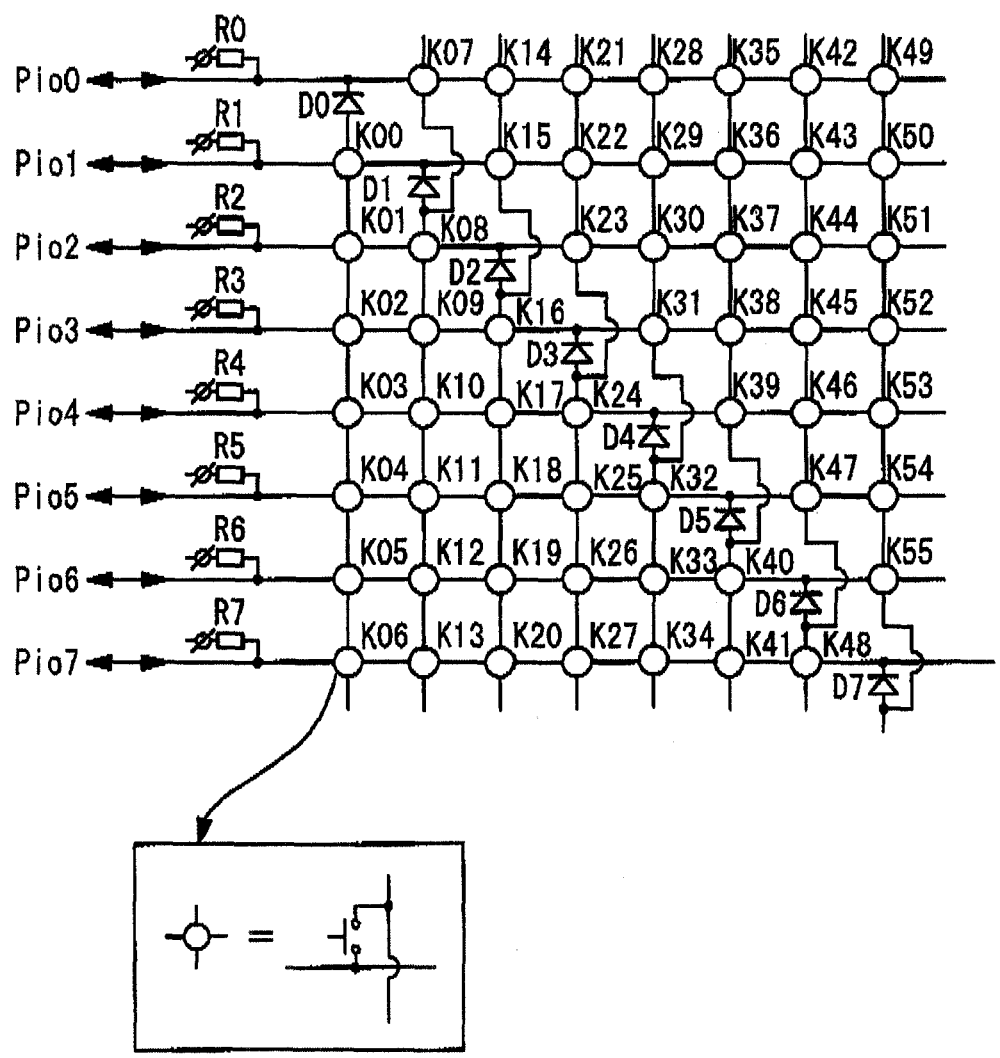
FIG. 2 is a block diagram illustrating a configuration of another related-art key input device.

As described above, the key input device as described in the document (JP-P2001-255983A) in Related Art 2 suffers from key-in waiting in a standby mode. For example, in the key matrix circuit shown in FIG. 2, when a key scan operation is stopped in the input state of Pio0 as and the output states of the others, it is difficult to recognize the key switches K00 to K06.

As described above, in the key input device 1 in the present embodiment, when the key scan operation is stopped so that the operation mode is shifted to the standby mode, the control section 3 sets the first signal line group 4 and the second signal line group 5 as input signal line groups and sets the third signal line group 6 as an output signal line group. In this case, if any one of the plurality of key switches in the key matrix section 2 is pushed down, the key matrix section 2 supplies the key return signal to the control section 3. The interruption detection circuit 12 generates the interrupt signal in response to this key return signal. The key input device 1 of the present embodiment maintains the standby mode until the interrupt signal scan operation is received and is shifted to the normal mode in response to this interrupt signal to start the key scan operation.

The plurality of embodiments described above can be practiced in combination within a range in which their configuration and operation create no inconsistency. Moreover, in the above embodiment, the configuration of the key input device 1 is illustrated in which the key matrix section 2 supplies the key return signal to the control section 3 in response to the key source signal supplied from the control section 3. The present invention has been illustrated, referring to a case that the control section 3 is a microcomputer. However, the control section 3 of the present invention is not limited to the microcomputer. For example, even forming the control section 3 with logical blocks on the same substrate as the key matrix section 2 can exert the same effect as that exerted in the embodiments above.

What is claimed is:

1. A key input device comprising:
a control section configured to receives a key return signal; and
a key matrix section having a plurality of keys,
said key matrix section comprises:
a plurality of signal line groups; and
a plurality of key switch groups comprising said plurality of keys,
wherein each of said plurality of key switch groups is provided between two or three of said plurality of signal line groups,
when an operated key of said plurality of keys is operated, said key return signal is transferred from said key matrix section to said control section through one of signal lines of one of said plurality of signal line groups, said one signal line corresponding to the operated key
wherein said key matrix section comprises:
first to third signal line groups; and
first to third key switch groups,
wherein said first signal line group has a plurality of first signal lines which extend in a first direction in said first key switch group and in a second direction orthogonal to said first direction in said second key switch group,
wherein said second signal line group has a plurality of second signal lines which extend in the first direction in said second and third key switch groups, and
wherein said third signal line group has a plurality of third signal wirings which extend in the second direction in said first key switch group and in the first direction in said second key switch group.

2. The key input device according to claim 1, wherein said control section comprises an input/output circuit group, which comprises a plurality of circuit input/output circuit blocks provided for said plurality of key switch groups, and each of said plurality of circuit input/output circuit blocks comprises a plurality of input/output circuits provided for said signal lines of the corresponding signal line group.

3. The key input device according to claim 2,
said control section receives said key return signal as an interrupt signal in a standby mode, to set a normal mode in response to said interrupt signal, and to perform a key scan operation in the normal mode to determine an operated key,
said key matrix section configured to supply said key return signal to said control section in response to an operation to the operated key of said plurality of keys.

4. The key input device according to claim 3, wherein each of said plurality of input/output circuits comprises:
an output circuit configured to output a key source signal to a corresponding one of said signal lines of a corresponding one of said signal line groups;
an input circuit configured to input said key return signal from the corresponding one of said signal lines of the corresponding one of said signal line groups, and to generate an interruption detection signal from said key return signal in the standby mode,
said control section further comprises:
an interrupt detection circuit connected to said input/output circuits in said input/output circuit group to generate an interrupt signal.

5. The key input device according to claim 4, wherein said control section comprises:
a storage section configured to store key return signals from each of said input/output circuits;
a table storing a data for a detection pattern of said key return signals;
a CPU configured to operate based on a program to compare said key return signals stored in said storage section and said table to determine said data.

6. The key input device according to claim 2, wherein said key matrix section comprises:
first to third signal line groups; and
first to third key switch groups,
said control section detects the operated key of said first key switch group based on a first key return signal as the key return signal from said first key switch group through said first signal line group when said control section outputs a key source signal on said third signal line group in a key scan operation,
said control section detects the operated key of said second key switch group based on a second key return signal as the key return signal from said second key switch group through said second signal line group when said control section outputs a key source signal on said first signal line group in said key scan operation, and
said control section detects the operated key of said third key switch group based on a third key return signal as the key return signal from said third key switch group through said third signal line group when said control section outputs a key source signal on said second signal line group in said key scan operation.

7. The key input device according to claim 2, wherein:
said first key switch group is provided between said first and third signal line groups,
said second key switch group is provided between said first to third signal line groups, and
said third key switch group is provided between said second and third signal line groups.

8. The key input device according to claim 1, wherein said control section comprises:
a storage section configured to store said key return signal;
a table storing a data for a detection pattern of said key return signals;
a CPU configured to operate based on a program to compare said key return signals stored in said storage section and said table to determine said data.

9. The key input device according to claim 8, wherein said control section comprises an input/output circuit group, which comprises a plurality of circuit input/output circuit blocks provided for said plurality of key switch groups, and each of said plurality of circuit input/output circuit blocks comprises a plurality of input/output circuits provided for said signal lines of the corresponding signal line group, wherein said control section receives said key return signal as an interrupt signal in a standby mode, to set a normal mode in response to said interrupt signal, and to perform a key scan operation in the normal mode to determine an operated key, and wherein said key matrix section configured to supply said key return signal to said control section in response to an operation to the operated key of said plurality of keys.

10. A method of detecting a data of an operated key in a key input device, comprising:

generating a key return signal in response to an operation to an operated key of a plurality of keys of a key matrix section;

receiving said key return signal as an interrupt signal in a standby mode;

switching an operation mode from the standby mode to a normal mode in response to said interrupt signal; and performing a key scan operation in the normal mode to determine the operated key, wherein said key matrix section comprises:

a plurality of signal line groups; and a plurality of key switch groups, wherein a first signal line group, of said plurality of signal line groups, has a plurality of first signal lines which extend in a first direction in a first key switch group, of said plurality of key switch groups, and in a second direction orthogonal to said first direction in a second key switch group, of said plurality of key switch groups, wherein a second signal line group, of said plurality of signal line groups, has a plurality of second signal lines which extend in the first direction in said second key switch group and a third key switch group, of said plurality of key switch groups, and wherein a third signal line group, of said plurality of signal line groups, has a plurality of third signal wirings which extend in the second direction in said first key switch group and in the first direction in said second key switch group.

11. The method according to claim 10, wherein:

each of said plurality of key switch groups is provided between two or three of said plurality of signal line groups, said generating comprises:

when the operated key of said plurality of keys is operated, transferring said key return signal from said key matrix section to a control section through one of signal lines of one of said plurality of signal line groups, said one signal line corresponding to the operated key.

12. The method according to claim 11, wherein said control section comprises an input/output circuit group, which comprises a plurality of circuit input/output circuit blocks provided for said plurality of key switch groups, and each of said plurality of circuit input/output circuit blocks comprises a plurality of input/output circuits provided for said signal lines of the corresponding signal line group.

13. The method according to claim 12, wherein said performing a key scan operation comprises:

outputting a key source signal from each of said plurality of input/output circuits to a corresponding one of said signal lines of a corresponding one of said signal line groups;

inputting said key return signal from the corresponding one of said signal lines of the corresponding one of said signal line groups;

generating an interruption detection signal from said key return signal in the standby mode; and generating an interrupt signal from the interruption signal.

14. The method according to claim 13, further comprising:

storing said key return signal from each of said input/output circuits; and comparing said stored key return signals and a table to determine said data, wherein said table stores a data for a detection pattern of said key return signals.

15. The method according to claim 12, wherein said performing comprises:

detecting an operated key of said first key switch group based on a first key return signal as the key return signal from said first key switch group through said first signal line group when said control section outputs a key source signal on said third signal line group in said key scan operation, detecting an operated key of said second key switch group based on a second key return signal as the key return signal from said second key switch group through said second signal line group when said control section outputs a key source signal on said first signal line group in said key scan operation, and detecting an operated key of said third key switch group based on a third key return signal as the key return signal from said third key switch group through said third signal line group when said control section outputs a key source signal on said second signal line group in said key scan operation.

16. The method according to claim 15, wherein said performing comprises:

returning said first key source signal as said first key return signal to said control section from each of a plurality of first key switches of said first key switch group in response to an operation by a user;

returning at least one of said first to third key source signals as said second key return signal to said control section from each of a plurality of second key switches of said second key switch group in response to an operation by the user; and returning said third key source signal as said third key return signal to said control section from each of a plurality of third key switches of said third key switch group in response to an operation by a user.

* * * * *